(12) United States Patent
Jain et al.

(10) Patent No.: US 9,088,472 B1
(45) Date of Patent: Jul. 21, 2015

(54) SYSTEM FOR COMPENSATING FOR I/Q IMPAIRMENTS IN WIRELESS COMMUNICATION SYSTEM

(71) Applicants: Nikhil Jain, Noida (IN); Arvind Kaushik, Ghaziabad (IN); Peter Z. Rashev, Calgary (CA); Amrit P. Singh, Ludhiana (IN)

(72) Inventors: Nikhil Jain, Noida (IN); Arvind Kaushik, Ghaziabad (IN); Peter Z. Rashev, Calgary (CA); Amrit P. Singh, Ludhiana (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/591,930

(22) Filed: Jan. 8, 2015

(51) Int. Cl.
*H04L 25/49* (2006.01)
*H04L 27/36* (2006.01)
*H03F 1/32* (2006.01)

(52) U.S. Cl.
CPC ............ *H04L 27/364* (2013.01); *H03F 1/3247* (2013.01); *H04L 27/368* (2013.01)

(58) Field of Classification Search
CPC .............. H04L 27/368; H04L 27/3863; H04L 2027/0018; H04B 2001/0425; H04B 1/0475; H04B 2001/0433; H04B 1/0075; H03F 1/3241; H03F 17/0294
USPC ............ 375/285, 296–297; 455/114.2, 114.3, 455/63.1
See application file for complete search history.

(56) References Cited

U.S. PATENT DOCUMENTS

| | | | |
|---|---|---|---|
| 5,900,778 | A | 5/1999 | Stonick |
| 7,515,650 | B1 * | 4/2009 | Warner et al. ................. 375/302 |
| 7,577,211 | B2 | 8/2009 | Braithwaite |
| 7,746,957 | B2 | 6/2010 | Ishikawa |
| 7,783,263 | B2 | 8/2010 | Sperlich |
| 7,796,960 | B1 | 9/2010 | Rashev |
| 8,233,852 | B2 | 7/2012 | Ahmed |
| 8,326,239 | B1 | 12/2012 | Peiris |
| 8,385,391 | B2 | 2/2013 | Balasubramanian |
| 8,463,189 | B2 | 6/2013 | Bashir |
| 8,588,353 | B2 | 11/2013 | Yang |
| 8,638,893 | B2 | 1/2014 | Dark |
| 2002/0048326 | A1 * | 4/2002 | Sahlman .................. 375/297 |
| 2003/0058959 | A1 | 3/2003 | Rafie |

(Continued)

FOREIGN PATENT DOCUMENTS

WO 2010136114 12/2010

OTHER PUBLICATIONS

Lei Guan and Anding Zhu, Low-Cost FPGA Implementation of Volterra Series-Based Digital Predistorter for RF Power Amplifiers, IEEE Transactions on Microwave Theory and Techniques, vol. 58, No. 4, Apr. 2010.

*Primary Examiner* — Khanh C Tran
(74) *Attorney, Agent, or Firm* — Charles Bergere

(57) ABSTRACT

A system for reducing in-phase and quadrature-phase (I/Q) impairments includes first, second, third, and fourth programmable registers for storing respective first, second, third, and fourth values, first and second finite impulse response (FIR) filters having respective first and second sets of filter taps, and first and second adders. The first FIR filter receives an I input signal and generates first and second intermediate output signals based on the first and second values for I and Q channels, respectively. The second FIR filter receives a Q input signal and generates third and fourth intermediate output signals based on the third and fourth values for the I and Q channels, respectively. The first and second adders receive the first and second, and the third and fourth intermediate output signals, respectively, and generate compensated I and Q output signals for the I and Q channels.

20 Claims, 5 Drawing Sheets

(56) References Cited

U.S. PATENT DOCUMENTS

| | | |
|---|---|---|
| 2004/0142667 A1* | 7/2004 | Lochhead et al. ......... 455/114.3 |
| 2005/0069050 A1* | 3/2005 | Ding et al. .................... 375/296 |
| 2005/0163252 A1* | 7/2005 | McCallister et al. ......... 375/296 |
| 2005/0249309 A1* | 11/2005 | Muller et al. ................. 375/296 |
| 2006/0240786 A1* | 10/2006 | Liu ............................ 455/114.3 |
| 2008/0260066 A1* | 10/2008 | Cai et al. ....................... 375/297 |
| 2011/0013724 A1* | 1/2011 | Metreaud et al. ............. 375/296 |
| 2012/0128098 A1 | 5/2012 | Haddad |
| 2013/0162349 A1 | 6/2013 | Gao |
| 2013/0243119 A1 | 9/2013 | Dalipi |
| 2014/0009224 A1 | 1/2014 | Van Zelm |

* cited by examiner

SYSTEM FOR COMPENSATING FOR I/Q IMPAIRMENTS IN WIRELESS COMMUNICATION SYSTEM

BACKGROUND OF THE INVENTION

The present invention generally relates to wireless communication systems, and, more particularly to a radio frequency (RF) transceiver for a wireless communication system.

RF transceivers are widely used for transmitting RF signals in wireless communication systems. An RF transceiver modulates a carrier wave by changing at least one of the characteristics of the carrier wave, viz. amplitude, frequency and phase based on an RF signal and transmits the RF signal using the carrier wave over the air. However, for effective transmission medium bandwidth utilization, the RF transceivers use advanced modulation techniques, which results in transmission of more data over the transmission medium. Thus, for efficient transmission and bandwidth utilization, the RF signal is divided into in-phase and quadrature-phase (I/Q) components that are transmitted by way of I and Q channels or transmission paths.

To overcome attenuation of the carrier wave, the RF transceiver includes a power amplifier for amplifying the RF signal prior to transmission. An ideal power amplifier has linear characteristics. However, actual power amplifiers exhibit linear characteristics only for a small fraction of their maximum output capacity. Thus, most of the time the power amplifier generates a distorted RF signal.

To compensate for the non-linear characteristics of the power amplifier, the RF transceiver includes a digital pre-distortion (DPD) unit that receives and pre-distorts digital I and Q signals to counter-balance the distortion generated by the power amplifier. Subsequent to pre-distortion, the DPD unit transmits the pre-distorted digital I and Q signals to the power amplifier.

FIG. 1 is a schematic block diagram of a conventional RF transceiver 100. The RF transceiver 100 includes a baseband processor 102, a DPD unit 104, a quadrature amplitude (QA) modulator 106, a power amplifier 108, an antenna 110, a QA demodulator 112, and a DPD controller 114.

The processor 102 receives a baseband signal (referred to as "$V_{BASEBAND}$" in FIG. 1) from a Layer 2 processor (not shown) and generates digital I and Q signals (referred to as "$V_{DIGITAL\_I}$" and "$V_{DIGITAL\_Q}$", respectively, in FIG. 1) corresponding to the baseband signal for I and Q channels, respectively.

The DPD unit 104 is connected to the processor 102 for receiving the digital I and Q signals and pre-distorting the digital I and Q signals to counterbalance the distortion introduced by the power amplifier 108 based on a set of coefficients stored in a lookup table (LUT, not shown), and generating pre-distorted digital I and Q signals (referred to as "$V_{PRE\text{-}DISTORTED\_I}$" and "$V_{PRE\text{-}DISTORTED\_Q}$", respectively, in FIG. 1) for the I and Q channels, respectively.

The QA modulator 106 is connected to the DPD unit 104 for receiving the pre-distorted digital I and Q signals, converting the pre-distorted digital I and Q signals into analog I and Q signals, modulating the analog I and Q signals, and generating a modulated signal (referred to as "$V_{MODULATED}$" in FIG. 1) for amplification.

The power amplifier 108 is connected to the QA modulator 106 for receiving the modulated signal and outputting an amplified modulated signal (referred to as "$V_{AMP\_MODULATED}$" in FIG. 1) for transmission by way of the antenna 110.

The QA demodulator 112 is connected to the antenna 110 for receiving the amplified modulated signal indicative of analog I and Q feedback signals, converting the amplified modulated signal into digital I and Q feedback signals (referred to as "$V_{FEEDBACK\_I}$" and "$V_{FEEDBACK\_Q}$", respectively, in FIG. 1), and outputting the digital I and Q feedback signals.

The DPD controller 114 is connected to the QA demodulator 112 for receiving the digital I and Q feedback signals and the processor 102 for receiving digital I and Q signals, and generating a control signal for updating the set of coefficients in the LUT.

Various parameters such as resistance and capacitance values of the analog components such as filters and mixers in the I and Q channels vary with time and temperature within the tolerance limit. The variation in the parameters of the analog components in the I and Q channels introduce I/Q impairments. The I/Q impairments include voltage offsets (DC offsets), differential gain characteristics between the I and Q channels, and differential phase characteristic between the I and Q channels. Thus I/Q impairments degrade the orthogonal relation between the digital I and Q signals. The DPD unit 104 compensates for the non-linear characteristics of the power amplifier 108, but the performance of the DPD unit 104 is decreased due to the I/Q impairments. To compensate for the I/Q impairments, the complexity of the DPD unit 104 and the DPD controller 114 increases.

One known technique to overcome the aforementioned problem uses a pre-correction unit for compensating for the DC offsets, and differential gain and phase characteristics, and other I/Q impairments between the I and Q channels.

FIG. 2 is a schematic block diagram of a conventional pre-correction unit 200 in an RF transceiver (not shown). The pre-correction unit 200 is connected between a DPD unit and a power amplifier for receiving pre-distorted digital I and Q signals (referred to as "$V_{PRE\text{-}DISTORTED\_I}$" and "$V_{PRE\text{-}DISTORTED\_Q}$", respectively, in FIG. 2), generating a pre-corrected digital I signal (referred to as "$V_{PRE\text{-}CORRECTED\_I}$" in FIG. 2), and providing the pre-corrected digital I signal and the pre-distorted digital Q signal to a QA modulator (not shown) for modulation. The QA modulator generates and provides a modulated signal to the power amplifier based on the pre-corrected digital I signal and the pre-distorted digital Q signal. The pre-correction unit 200 includes first and second finite impulse response (FIR) filters 202 and 204 and an adder 206. The first FIR filter 202 receives the pre-distorted digital I signal and generates a first intermediate output signal (referred to as "$V_{INT\_OUT\_1}$" in FIG. 2). The second FIR filter 204 receives the pre-distorted digital Q signal and generates a second intermediate output signal (referred to as "$V_{INT\_OUT\_2}$" in FIG. 2). The adder 206 is connected to the first and second FIR filters 202 and 204 for receiving the first and second intermediate output signals, respectively, and generating the pre-corrected digital I signal for the I channel. A controller unit (not shown) generates a control signal for the pre-correction unit 200 for controlling and updating filter tap coefficients of the first and second FIR filters 202 and 204 based on a comparison between the pre-distorted digital I and Q signals received from the DPD unit and digital I and Q feedback signals received from a QA demodulator (not shown). Thus, the I/Q impairments between the I channel and the Q channel are controlled by updating the filter tap coefficients of the first and second FIR filters 202 and 204.

The pre-correction unit 200 reduces the I/Q impairments between the I and Q channels by filtering the pre-distorted digital I and Q signals and provides compensation only for the I channel. Thus, the pre-correction unit 200 reduces the I/Q impairments only for the I channel. Thus, controllability over compensation of the I/Q impairments between the I and Q channels is limited to only the I channel, and hence, the controllability is reduced. Reduced controllability results in poor frequency selectivity leading to unsatisfactory compensation of the I/Q impairments. Further, the signal path between the QA modulator and the QA demodulator includes the power amplifier that has inherent non-linear characteristics, thereby resulting in gain and phase distortion of the frequency components of the modulated signal. Therefore, unwanted frequency components are introduced in the transmitted RF signal, thereby leading to intermodulation distortion.

Thus, as the compensation between the I and Q channels is limited to only the I channel and as the I/Q impairments are dependent on the frequencies of the pre-distorted digital I and Q signals, the pre-correction unit 200 requires more hardware to provide compensation. This increases complexity of the pre-correction unit 200. Reducing the complexity of the pre-correction unit 200 requires good quality hardware for the QA modulator and the QA demodulator, which in turn increases the cost of the RF transceiver. Furthermore, number of filter taps in the first and second FIR filters 202 and 204 are not programmable and thus, the compensation provided by the pre-correction unit 200 is not adjustable based on the I/Q impairments or the characteristics of the pre-distorted I and Q signals, i.e., the pre-correction unit 200 is not programmable as per user requirement.

Another technique for compensating for the I/Q impairments between the I and Q channels is to use a computing system such as a microprocessor that interfaces with the RF transceiver. The microprocessor is configured to process the digital I and Q signals and compute elements of a 2×2 matrix based on a correction algorithm. The computing system computes the elements of the 2×2 matrix by measuring the I/Q impairments as a function of frequency and characterization tones of the digital I and Q signals and provides analog I and Q signals to the RF transceiver for transmission. However, the technique does not enable execution of the correction algorithm in the time-domain, and hence, does not allow the I/Q impairment compensation in the time domain. Moreover, the technique does not provide a solution for effective area and power utilization of the RF transceiver.

Therefore, it would be advantageous to have a system that compensates for the I/Q impairments between the I and Q channels, provides better control over the I/Q impairments between the I and Q channels, reduces intermodulation distortion, and allows for an efficient hardware implementation for the I/Q impairment compensation.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
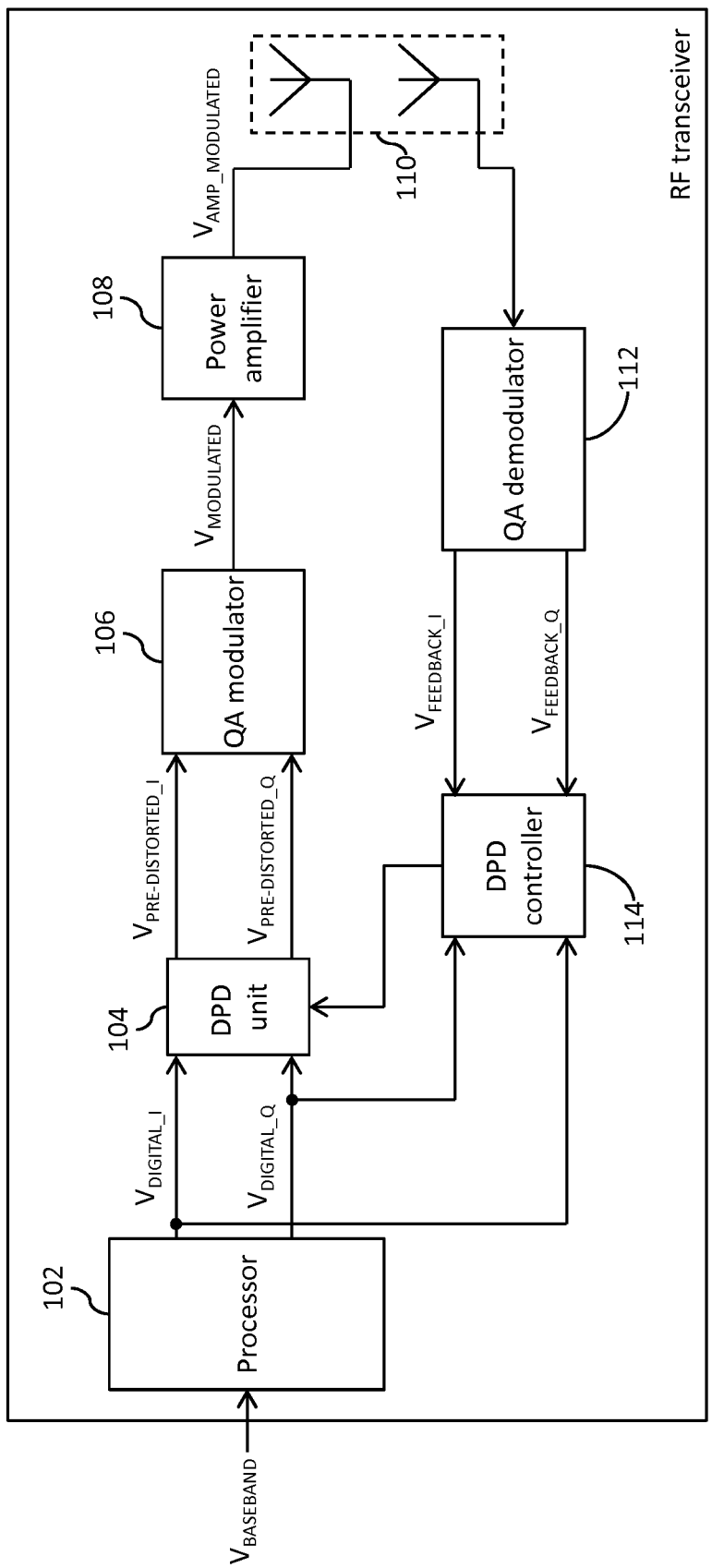
FIG. 1 is a schematic block diagram of a conventional RF transceiver.
Figure 2:
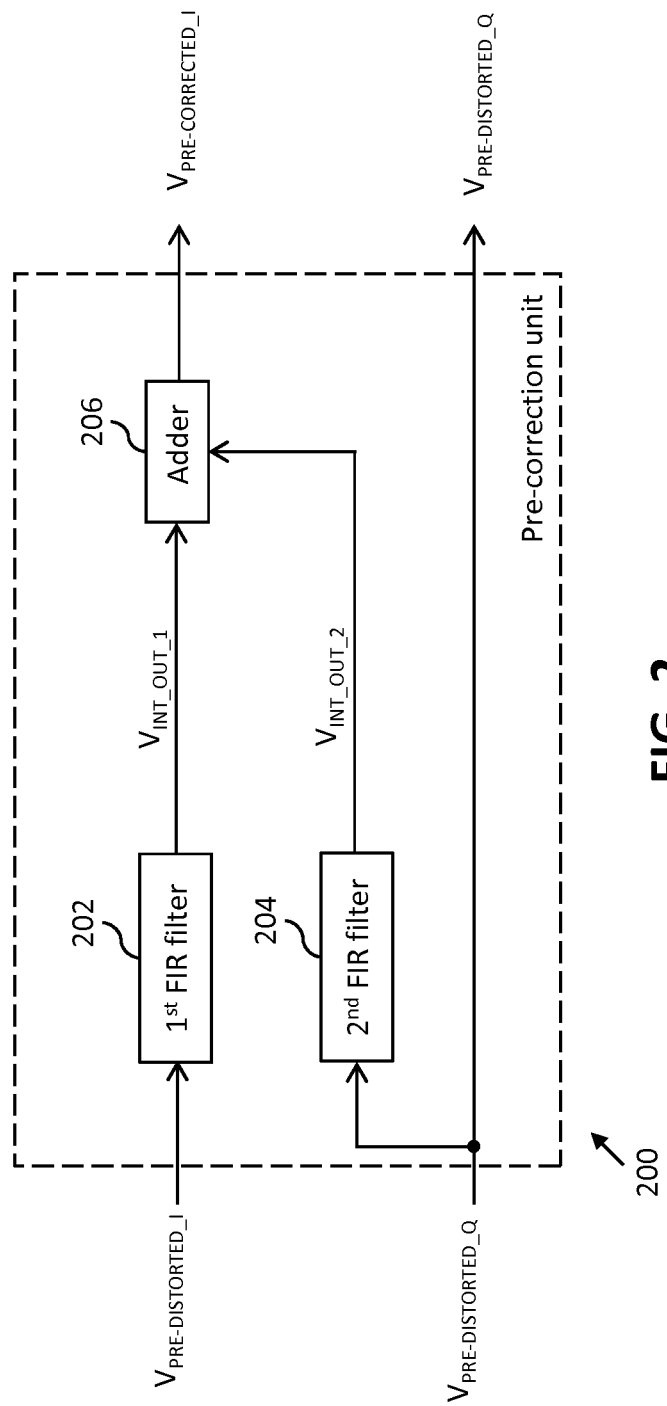
FIG. 2 is a schematic block diagram of a conventional pre-correction unit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a system for compensating in-phase and quadrature-phase (I/Q) impairments of I/Q input signals is provided. The system includes first through fourth programmable registers, first and second finite impulse response (FIR) filter modules, and first and second adders. The first through fourth programmable registers store first through fourth values, respectively. The first filter module includes a first set of filter taps, receives the first and second values and the I input signal, selects a first subset of the first set of filter taps for a first I signal path based on the first value to generate a first intermediate output signal, and selects a second subset of the first set of filter taps for a first Q signal path based on the second value to generate a second intermediate output signal. The second FIR filter module includes a second set of filter taps, receives the third and fourth values and the Q input signal, selects a first subset of the second set of filter taps for a second I signal path based on the third value to generate a third intermediate output signal, and selects a second subset of the second set of filter taps for a second Q signal path based on the fourth value to generate a fourth intermediate output signal. The first adder receives the first and third intermediate output signals and generates a compensated I output signal. The second adder receives the second and fourth intermediate output signals and generates a compensated Q output signal.

In another embodiment of the present invention, a system for compensating I/Q impairments of I/Q input signals is provided. The system includes first through fourth programmable registers, first through fourth finite impulse response (FIR) filters, and first and second adders. The first through fourth programmable registers store first through fourth values, respectively. The first FIR filter includes a first set of filter taps, receives the first and second values and the I input signal, selects the first set of filter taps for a first I signal path, and generates a first intermediate output signal. The second FIR filter includes a second set of filter taps, receives the first and second values and the I input signal, selects the second set of filter taps for a first Q signal path, and generates a second intermediate output signal. The third FIR filter includes a third set of filter taps, receives the third and fourth values and the Q input signal, selects the third set of filter taps for a second I signal path, and generates a third intermediate output signal. The fourth FIR filter includes a fourth set of filter taps, receives the third and fourth values and the Q input signal, selects the fourth set of filter taps for a second Q signal path, and generates a fourth intermediate output signal. The first adder receives the first and third intermediate output signals and generates a compensated I output signal. The second adder receives the second and fourth intermediate output signals and generates a compensated Q output signal.

Various embodiments of the present invention provide a system for compensating I/Q impairments of I/Q input signals. The system includes first through fourth programmable registers, first and second finite impulse response (FIR) filter modules, and first and second adders. The first through fourth registers store first through fourth values, respectively. The first FIR filter module includes a first set of filter taps, receives the first and second values and the I input signal, selects a first subset of the first set of filter taps for a first I signal path based on the first value for generating a first intermediate output signal, and selects a second subset of the first set of filter taps for a first Q signal path based on the second value for generating a second intermediate output signal. The second FIR filter module includes a second set of filter taps, receives the third and fourth values and the Q input signal, selects a first subset of the second set of filter taps for a second I signal path based on the third value for generating a third intermediate output signal, and selects a second subset of the second set of filter taps for a second Q signal path based on the fourth value for generating a fourth intermediate output signal.

The first adder receives the first and third intermediate output signals and generates a compensated I output signal for an I channel. The second adder receives the second and fourth intermediate output signals, respectively, and generates a compensated Q output signal for a Q channel. A controller unit updates filter tap coefficients of each of the first and second sets of filter taps, thereby controlling and modifying the frequency components of the first through fourth intermediate output signals, and hence, the system provides improved controllability over the I/Q impairments. Thus, the system reduces the I/Q impairments between the I and Q channels and hence, provides compensation for the I and Q channels. Improved controllability results in better frequency selectivity, thereby compensating for errors such as, but is not limited to, amplitude and phase ripple introduced in a modulated signal. Furthermore, since the system does not require any additional high-complex logic modules such as multipliers, the system can provides improved results even with low quality RF transceiver hardware. Further, the first through fourth registers are programmable, and hence, the I/Q impairment compensation is programmable. As the first through fourth programmable registers can be programmed as per user requirement, the number of filter taps providing compensation in the I and Q channels can be adjusted, thereby leading to better area and power utilization of an RF transceiver.

Figure 3:
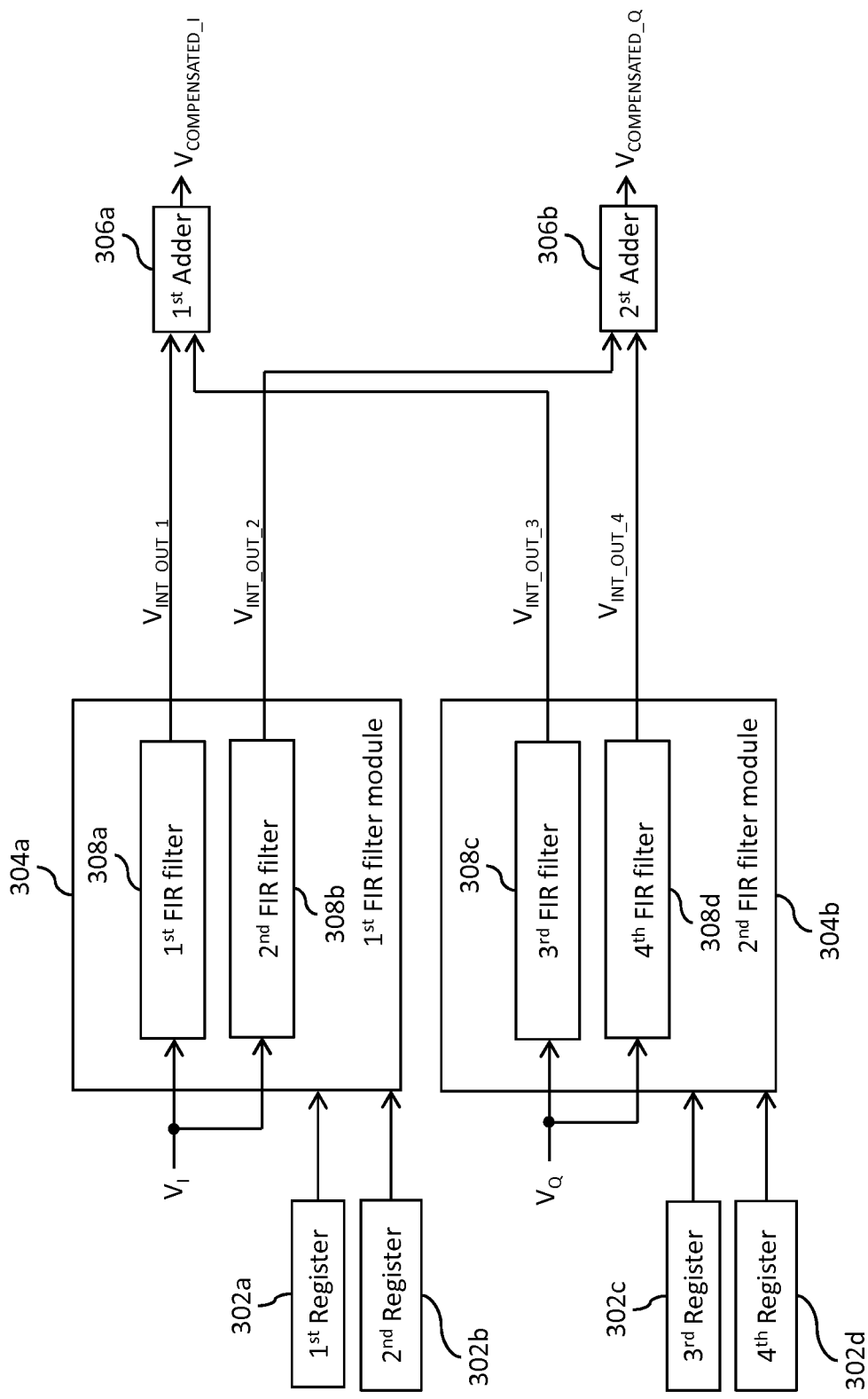
FIG. 3 is a schematic block diagram of a pre-correction unit in accordance with an embodiment of the present invention.

FIG. 3 is a schematic block diagram of a pre-correction unit 300 in accordance with an embodiment of the present invention. The pre-correction unit 300 compensates in-phase and quadrature-phase (I/Q) impairments of I/Q input signals (referred to as "$V_I$" and "$V_Q$", respectively, in FIG. 3) for I and Q channels. The pre-correction unit 300 includes first through fourth programmable registers 302a-302d (collectively referred as programmable registers 302), first and second FIR filter modules 304a and 304b (collectively referred as FIR filter modules 304) having first and second sets of filter taps (not shown), respectively, and first and second adders 306a and 306b (collectively referred as adders 306).

The first through fourth programmable registers 302a-302d store first through fourth values, respectively. The first value comprises a first set of bits that is indicative of a count of a first subset of the first set of filter taps for a first I signal path. The second value comprises a second set of bits that is indicative of a count of a second subset of the first set of filter taps for a first Q signal path. The first Q signal path is a diagonal path between the I channel and the Q channel. The third value comprises a third set of bits that is indicative of a count of a first subset of the second set of filter taps for a second I signal path. The second I signal path is a diagonal path between the Q channel and the I channel. The fourth value comprises a fourth set of bits that is indicative of a count of a second subset of the second set of filter taps for a second Q signal path. The programmable registers 302 store the first through fourth values as binary codes. In an example, the programmable registers receive the first through fourth values from an external processor (not shown). The first through fourth values are provided to the external processor by a user. Thus, the programmable registers 302 are programmable as per user requirement and hence, provide greater controllability over the compensation of the I/Q impairments between the I and Q channels.

The first FIR filter module 304a is connected to the first and second programmable registers 302a and 302b for receiving the first and second sets of bits. The first FIR filter module 304a includes a first set of select logic modules corresponding to the first set of filter taps, a first set of delay modules corresponding to the first set of filter taps, and first and second accumulators (collectively not shown). Each select logic module of the first set of select logic modules receives corresponding bits of the first and second sets of bits for selecting a corresponding filter tap of the first set of filter taps as one of the first and second subsets of the first set of filter taps. The first accumulator is connected to the first subset of the first set of filter taps. The second accumulator is connected to the second subset of the first set of filter taps. The first and second accumulators accumulate data received from the first and second subsets of the first set of filter taps, respectively, and output first and second intermediate output signals (referred to as "$V_{INT\_OUT\_1}$" and "$V_{INT\_OUT\_2}$", respectively, in FIG. 3) for the first I signal and first Q signal paths, respectively.

The first subset of the first set of filter taps, the delay modules corresponding to the first subset of the first set of filter taps, and the first accumulator form a first FIR filter 308a. Thus, the first FIR filter 308a outputs the first intermediate output signal for the first I signal path, thereby providing I impairment compensation in the I channel. Thus, the first I signal path includes the first FIR filter 308a that provides compensation in the I channel based on the I input signal.

The second subset of the first set of filter taps, the delay modules corresponding to the second subset of the first set of filter taps, and the second accumulator form a second FIR filter 308b. Thus, the second FIR filter 308b outputs the second intermediate output signal for the first Q signal path, thereby providing I impairment compensation in the Q channel. Thus, the first Q signal path includes the second FIR filter 308b that provides compensation in the Q channel based on the I input signal.

The second FIR filter module 304b is connected to the first and second programmable registers 302c and 302d for receiving the third and fourth sets of bits. The second FIR filter module 304b includes a second set of select logic modules corresponding to the second set of filter taps, a second set of delay modules corresponding to the second set of filter taps, and third and fourth accumulators (collectively not shown). Each select logic module of the second set of select logic modules receives corresponding bits of the third and fourth sets of bits for selecting a corresponding filter tap of the second set of filter taps as one of the first and second subsets of the second set of filter taps. The third accumulator is connected to the first subset of the second set of filter taps. The fourth accumulator is connected to the second subset of the second set of filter taps. The third and fourth accumulators accumulate data received from the first and second subsets of the second set of filter taps, respectively, and output third and fourth intermediate output signals (referred to as "$V_{INT\_OUT\_3}$" and $V_{INT\_OUT\_4}$", respectively, in FIG. 3) as for the second I signal and second Q signal paths, respectively.

The first subset of the second set of filter taps, the delay modules corresponding to the first subset of the second set of filter taps, and the third accumulator form a third FIR filter 308c. Thus, the third FIR filter 308c outputs the third intermediate output signal for the second I signal path, thereby providing Q impairment compensation in the I channel. Thus, the second I signal path includes the third FIR filter 308c that provides compensation in the I channel based on the Q input signal.

The second subset of the second set of filter taps, the delay modules corresponding to the second subset of the second set of filter taps, and the fourth accumulator form a fourth FIR filter 308d. Thus, the fourth FIR filter 308d outputs the fourth intermediate output signal for the second Q signal path, thereby providing Q impairment compensation in the Q channel. Thus, the second Q signal path includes the fourth FIR filter 308d that provides compensation in the Q channel based on the Q input signal.

The first adder 306a is connected to the first and third FIR filters 308a and 308c for receiving the first and third intermediate output signals and generating a compensated I output signal (referred to as "$V_{COMPENSATED\_I}$" in FIG. 3) for the I channel. The second adder 306b is connected to the second and fourth FIR filters 308b and 308d for receiving the second and fourth intermediate output signals and generating a compensated Q output (referred to as "$V_{COMPENSATED\_Q}$" in FIG. 3) signal for the Q channel. In an embodiment of the present invention, the first and second adders 306a and 306b further receive DC offset compensation control signals to compensate for DC offsets in the I and Q input signals.

Thus, the first and third FIR filters 308a and 308c provide compensation in the I channel based on the I and Q input signals. The second and fourth FIR filters 308b and 308d provide compensation in the Q channel based on the I and Q input signals. Further, a controller unit (not shown) updates filter tap coefficients of each of the first through fourth FIR filters 308a-308d, thereby controlling the frequency characteristics of the first through fourth FIR filters 308a-308d and hence, providing better controllability over the compensation of the I/Q impairments between the I and Q channels. Moreover, the programmable registers 302 are programmable as per user requirement, thereby further improving the controllability over the compensation of the I/Q impairments between the I and Q channels. Improved controllability results in better frequency selectivity, thereby compensating for errors such as, but is not limited to, amplitude and phase ripple introduced in a modulated signal. Furthermore, since the pre-correction unit 300 does not require any additional high-complex logic modules such as multipliers, the pre-correction unit 300 provides good quality results even with low quality RF transceiver hardware. As the pre-correction unit 300 provides improved controllability, phase and gain distortion introduced in the modulated signal due to the non-linear characteristics of a power amplifier (not shown) are also reduced, thereby reducing intermodulation distortion. As the first through fourth programmable registers 302a-302d can be programmed as per user requirement, the number of filter taps in the first through fourth FIR filters 308a-308d that provide I/Q impairment compensation between the I and Q channels can be adjusted, thereby leading to better area and power utilization of an RF transceiver.

Figure 4:
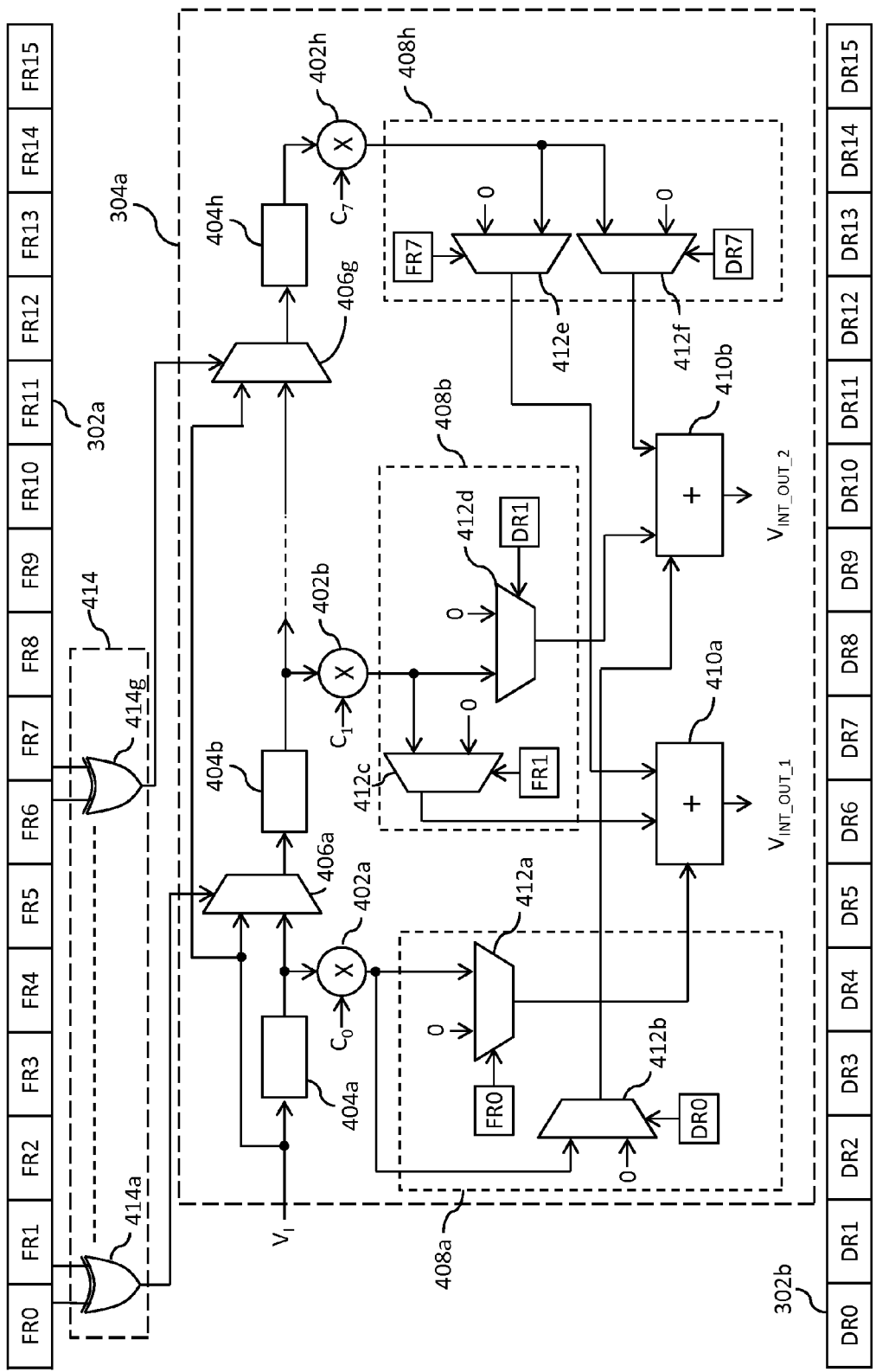
FIG. 4 is a schematic block diagram of the first FIR filter module of the pre-correction unit of FIG. 3 in accordance with an embodiment of the present invention.

FIG. 4 illustrates a schematic block diagram of the first FIR filter module 304a of the pre-correction unit 300 in accordance with an embodiment of the present invention. The first FIR filter module 304a is connected to the first and second programmable registers 302a and 302b for receiving the first and second sets of bits. The first FIR filter module 304a includes first through eighth filter taps 402a-402h (collectively referred to as the first set of filter taps 402), first through eighth delay modules 404a-404h (collectively referred to as the first set of delay modules 404), first through seventh multiplexers 406a-406g or muxes 406a-406g (collectively referred to as muxes 406) and first through eighth select logic modules 408a-408h (collectively referred to as first set of select logic modules 408), and first and second accumulators 410a and 410b.

Each select logic module of the first set of select logic module 408 includes multiple muxes. In an example, the first select logic module 408a includes eighth and ninth muxes 412a and 412b. The second select logic module 408b includes tenth and eleventh muxes 412c and 412d. Similarly, the eighth select logic module 408h includes twelfth and thirteenth muxes 412e and 412f.

In operation, the first delay module 404a receives the I input signal and outputs a first delayed I input signal. In an example, if the first delay module 404a receives the I input signal as F(n), the first delay module 404a outputs the first delayed I input signal as F(n−1). The first filter tap 402a receives the first delayed I input signal, multiplies the first delayed I input signal with a filter tap coefficient (also known as "weight") $C_0$ received from a lookup table (LUT, not shown) and outputs a first weighted signal.

The eighth mux 412a receives a signal corresponding to a logic low state and the first weighted signal, and outputs a first output signal based on the logic state of a first bit of the first set of bits stored in the first programmable register 302a. The first output signal is at least one of the signal corresponding to the logic low state and the first weighted signal. The ninth mux 412b receives the signal corresponding to the logic low state and the first weighted signal, and outputs a second output signal based on the logic state of a first bit of the second set of bits. The second output signal is at least one of the signal corresponding to the logic low state and the first weighted signal. The first and second accumulators 410a and 410b are connected to the eighth and ninth muxes 412a and 412b for receiving the first and second output signals, respectively. Thus, the first select logic module 408a provides the first weighted signal to one of the first and second accumulators 410a and 410b based on the first bits of the first and second sets of bits.

In an example, to select the first filter tap 402a for the first I signal path (I channel), i.e., to include the first filter tap 402a in the first subset of the first set of filter taps 402, the first bit of the first set of bits is programmed to be at a logic high state. Contradictorily, the first bit of the second set of bits is programmed to be at a logic low state. Thus, the eighth mux 412a outputs the first weighted signal as the first output signal and the ninth mux 412b outputs the second output signal at logic low state. Thus, the first accumulator 410a receives the first weighted signal as the first output signal and outputs the first intermediate output signal based on the first weighted signal.

Similarly, the second through eighth select logic modules 408b-408h select the second through eighth filter taps 402b-402h for at least one of the first I and first Q signal paths.

Since the first and second sets of bits enable selection of the first set of filter taps 402 for at least one of the I and Q channels, the FIR filter module 304a is connected to the first programmable register 302a by way of a first set of XOR gates 414 that includes first through seventh XOR gates 414a-414g. The first set of XOR gates 414 are used to select the inputs to the second through eighth delay modules 404b-404h based on the first and second sets of bits. The XOR gates 414a-414g select the inputs to the first through seventh muxes 406a-406g such that no two filter taps of the first set of filter taps 402 that are selected for the I channel receive the same samples of the I input signal. Similarly, the first set of XOR gates 414 ensures that no two filter taps of the first set of filter taps 402 that are selected for the Q channel receive the same samples of the I input signal.

In an example, the first XOR gate 414a receives the signal corresponding to the logic state of the first bit of the first set of bits and a signal corresponding to a logic state of a second bit of the first set of bits and generates a first select signal. The first mux 406a receives the I input signal and the first delayed I input signal and outputs a first intermediate signal based on the first select signal. The first intermediate signal is at least one of the I input signal and the first delayed I input signal.

In the example, since the first bit of the first set of bits is programmed to be at a logic high state and the second bit of the first set of bits is programmed to be at a logic high state to select the second filter tap 402b for the first I signal path (that provides I compensation in the I channel), the first select signal is at a logic low state and the first mux 406a outputs the first delayed I input signal as the first intermediate signal. Thus, the second delay module 404b receives the first delayed I input signal as the first intermediate signal.

However, if the second bit of the first set of bits is programmed to be at a logic low state to select the second filter tap 402b for the first Q signal path (that provides I compensation in the Q channel), the first select signal is at a logic high state and the first mux 406a outputs the first I input signal as the first intermediate signal. Thus, the second delay module 404b receives the first I input signal as the first intermediate signal. Thus, the first set of XOR gates 414 ensures that the filter taps of the first set of filter taps 402 receive the correct samples of the I input signal.

In an example, the first set of bits are configured to select the first, third, and fifth filter taps 402a, 402c and 402e for the first I signal path and the second, fourth, sixth, seventh and eighth filter taps 402b, 402d, 402f, 402g, and 402h. The first accumulator 410a receives the first, third, and fifth output signals and generates the first intermediate output signal. The second accumulator receives second, fourth, sixth, seventh, and eighth output signals and generates the second intermediate output signal.

Thus, the first, third, and fifth select logic modules 408a, 408c, and 408e select the first, third, and fifth filter taps 402a, 402c, and 402e for forming the first FIR filter 308a of the pre-correction unit 300 of FIG. 3, for providing compensation in the I channel based on the I input signal. The second, fourth, sixth, seventh, and eighth select logic modules 408b, 408d, 408f, 408g, and 408h select the second, fourth, sixth, seventh, and eighth filter taps 402b, 402d, 402f, 402g, and 402h for forming the second FIR filter 308b of the pre-correction unit 300 of FIG. 3, for providing compensation in the Q channel based on the I input signal. Thus, the first set of select logic modules 408 selects filter taps of the first set of filter taps 402 as one of the first and second subsets of the first set of filter taps 402 based on the bits of the first and second sets of bits stored in the first and second register 308a and 308b, respectively.

It will be understood by those of skill in the art that the second filter module 304b of FIG. 3 is structurally and functionally similar to the first FIR filter module 304a of FIG. 4.

Figure 5:
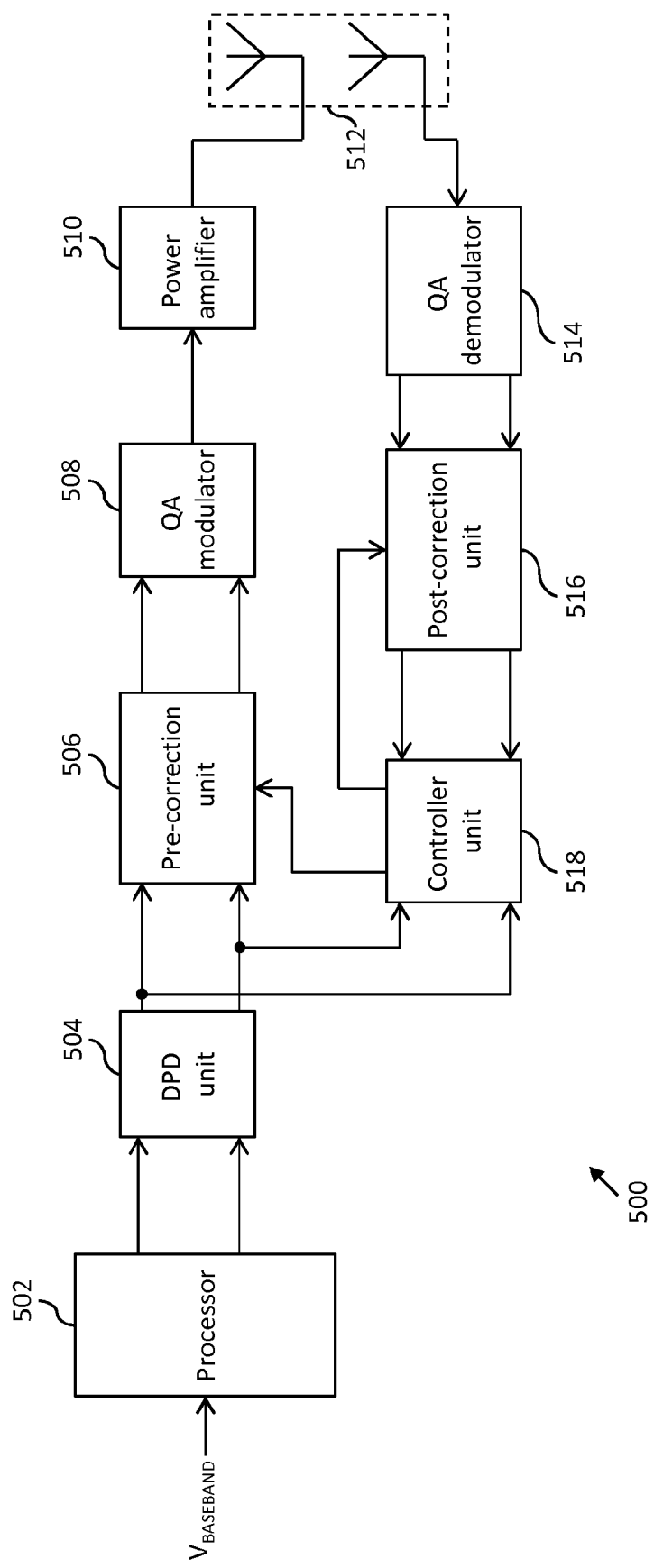
FIG. 5 is a schematic block diagram of an RF transceiver in accordance with an embodiment of the present invention.

FIG. 5 illustrates a schematic block diagram of an RF transceiver 500 in accordance with an embodiment of the present invention. The RF transceiver 500 includes a baseband processor 502, a digital pre-distortion (DPD) unit 504, a pre-correction unit 506, a quadrature amplitude (QA) modulator 508, a power amplifier 510, an antenna 512, a QA demodulator 514, a post-correction unit 516, and a controller unit 518.

The processor 502 receives a baseband signal (referred to as "$V_{BASEBAND}$" in FIG. 5) from a Layer 2 processor (not shown) and generates digital I and Q signals corresponding to the baseband signal for I and Q channels in a transmission path, respectively.

The DPD unit 504 is connected to the processor 502 for receiving the digital I and Q signals and pre-distorting the digital I and Q signals to counterbalance the distortion introduced by the power amplifier 510, and generating pre-distorted digital I and Q signals for the I and Q channels in the transmission path, respectively.

The pre-correction unit 506 is structurally and functionally similar to the pre-correction unit 300 of FIG. 3. The pre-correction unit 506 is connected to the DPD unit 504 for receiving the pre-distorted digital I and Q signals and generating pre-corrected digital I and Q signals for the I and Q channels in the transmission path, respectively, based on a first set of coefficients.

The QA modulator 508 is connected to the pre-correction unit 506 for receiving the pre-corrected digital I and Q signals, converting the pre-corrected digital I and Q signals into analog I and Q signals, modulating the analog I and Q signals, and generating a modulated signal for amplification.

The power amplifier 510 is connected to the QA modulator 508 for receiving the modulated signal and outputting an amplified modulated signal for transmission by way of the antenna 512.

The QA demodulator 514 is connected to the antenna 512 for receiving the amplified modulated signal indicative of analog I and Q feedback signals, converting the amplified modulated signal into digital I and Q feedback signals, and outputting the digital I and Q feedback signals for I and Q channels in a feedback path, respectively.

The post-correction unit 516 is structurally and functionally similar to the pre-correction unit 300 of FIG. 3. The post-correction unit 516 is connected to the QA demodulator 514 for receiving the digital I and Q feedback signals and generating post-corrected digital I and Q feedback signals for the I and Q channels of the feedback path, respectively, based on a second set of coefficients.

The controller unit 518 is connected to the DPD unit 504 for receiving the pre-distorted digital I and Q signals and the post-correction unit 516 for receiving the post-corrected digital I and Q feedback signals, and generating first and second control signals based on a comparison between the pre-distorted digital I and Q signals and the post-corrected digital I and Q signals for updating the first and second set of coefficients, respectively.

The pre-correction unit 506 provides compensation for the I and Q channels in the transmission path based on the pre-distorted digital I and Q signals, thereby providing I/Q impairment compensation and DC offset compensation between the I and Q channels in the transmission path. The post-correction unit 516 provides compensation for the I and Q channels in the feedback path based on the digital I and Q feedback signals, thereby providing I/Q impairment compensation and DC offset compensation between the I and Q channels in the feedback path. Further, the controller unit 518 generates the first and second control signals for updating the first and second set of coefficients, thereby controlling the frequency characteristics of FIR filters (not shown) in the pre-correction unit 506 and the post-correction unit 516. This results in better controllability over the I/Q impairments between the I and Q channels in the transmission and feedback paths. Furthermore, number of filter taps in the FIR filters in the pre-correction unit 506 and the post-correction unit 516 are programmable, thereby leading to effective area and power utilization of the RF transceiver 500. Improved controllability results in better frequency selectivity and further compensates for errors such as, but not limited to, amplitude and phase ripples introduced in the modulated signal and intermodulation distortion.

Thus, in various embodiments of the present invention, the pre-correction unit 300 provides compensation for the I and Q channels. The first through fourth FIR filters 308a-308d of the pre-correction unit 300 are configurable via filter tap coefficients, thereby controlling the frequency characteristics of the first through fourth FIR filters 308a-308d for reducing the I/Q impairments between the I and Q channels in the transmission path and intermodulation distortion. The pre-correction unit 300 is programmable via the first through fourth programmable registers 302a-302d and hence, the pre-correction unit 300 can be programmed as per user requirement to provide the necessary compensation for the I/Q impairments.

It will be further understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for compensating for in-phase and quadrature-phase (I/Q) impairments of I/Q input signals, comprising:
    first, second, third, and fourth programmable registers for storing respective first, second, third, and fourth values;
    a first finite impulse response (FIR) filter module having a first set of filter taps connected to the first and second programmable registers for receiving the first and second values, respectively, for receiving the I input signal, selecting a first subset of the first set of filter taps for a first I signal path based on the first value to generate a first intermediate output signal, selecting a second subset of the first set of filter taps for a first Q signal path based on the second value to generate a second intermediate output signal;
    a second FIR filter module having a second set of filter taps, connected to the third and fourth programmable registers for receiving the third and fourth values, respectively, for receiving the Q input signal, selecting a first subset of the second set of filter taps for a second I signal path based on the third value to generate a third intermediate output signal, selecting a second subset of the second set of filter taps for a second Q signal path based on the fourth value to generate a fourth intermediate output signal;
    a first adder connected to the first and second FIR filter modules for receiving the first and third intermediate output signals, respectively, and generating a compensated I output signal; and
    a second adder connected to the first and second FIR filter modules for receiving the second and fourth intermediate output signals, respectively, and generating a compensated Q output signal.

2. The system of claim 1, wherein the first FIR filter module includes first and second accumulators and a first set of delay modules corresponding to the first set of filter taps.

3. The system of claim 2, wherein the first subset of the first set of filter taps and corresponding delay modules of the first set of delay modules and the first accumulator form a first FIR filter.

4. The system of claim 3, wherein the second subset of the first set of filter taps and corresponding delay modules of the first set of delay modules and the second accumulator form a second FIR filter.

5. The system of claim 4, wherein the second FIR filter module includes third and fourth accumulators and a second set of delay modules corresponding to the second set of filter taps.

6. The system of claim 5, wherein the first subset of the second set of filter taps and corresponding delay modules of the second set of delay modules and the third accumulator form a third FIR filter.

7. The system of claim 6, wherein the second subset of the second set of filter taps and corresponding delay modules of the second set of delay modules and the fourth accumulator form a fourth FIR filter.

8. The system of claim 1, wherein the first value comprises a first set of bits that is indicative of a count of the first subset of the first set of filter taps, the second value comprises a second set of bits that is indicative of a count of the second subset of the first set of filter taps, the third value comprises a third set of bits that is indicative of a count of the first subset of the second set of filter taps, and the fourth value comprises a fourth set of bits that is indicative of a count of the second subset of the second set of filter taps.

9. The system of claim 8, wherein the first FIR filter module includes a first set of select logic modules corresponding to the first set of filter taps and the second FIR filter module includes a second set of select logic modules corresponding to the second set of filter taps.

10. The system of claim 9, wherein a select logic module of the first set of select logic modules selects corresponding filter tap of the first set of filter taps for at least one of the first I and first Q signal paths and a select logic module of the second set of filter taps selects corresponding filter tap of the second set of filter taps for at least one of the second I and second Q signal paths.

11. The system of claim 10, wherein a select logic module of the first set of select logic modules includes first and second multiplexers, wherein the first multiplexer is connected to the first programmable register for receiving a bit of the first set of bits and selecting corresponding filter tap of the first set of filter taps as one of the first and second subsets of the first set of filter taps, and wherein the second multiplexer is connected to the second programmable register for receiving a bit of the second set of bits and selecting corresponding filter tap of the first set of filter taps as one of the first and second subsets of the first set of filter taps.

12. The system of claim 10, wherein a select logic module of the second set of select logic modules includes first and second multiplexers, wherein the first multiplexer is connected to the third programmable register for receiving a bit of the third set of bits and selecting corresponding filter tap of the second set of filter taps for at least one of the first and second subsets of the second set of filter taps, and wherein the second multiplexer is connected to the fourth programmable register for receiving a bit of the fourth set of bits and selecting corresponding filter tap of the second set of filter taps for at least one of the first and second subsets of the second set of filter taps.

13. A system for compensating in-phase and quadrature-phase (I/Q) impairments of (I/Q) input signals, comprising:
   first, second, third, and fourth programmable registers for storing first, second, third, and fourth values, respectively;
   a first finite impulse response (FIR) filter having a first set of filter taps, connected to the first and second programmable registers for receiving the first and second values, for receiving the I input signal, selecting the first set of filter taps for a first I signal path, and generating a first intermediate output signal;
   a second FIR filter having a second set of filter taps, connected to the first and second programmable registers for receiving the first and second values, for receiving the I input signal, selecting the second set of filter taps for a first Q signal path, and generating a second intermediate output signal;
   a third FIR filter having a third set of filter taps, connected to the third and fourth programmable registers for receiving the third and fourth values, for receiving the Q input signal, selecting the third set of filter taps for a second I signal path, and generating a third intermediate output signal;
   a fourth FIR filter having a fourth set of filter taps, connected to the third and fourth programmable registers for receiving the third and fourth values, for receiving the Q input signal, selecting the fourth set of filter taps for a second Q signal path, and generating a fourth intermediate output signal;
   a first adder connected to the first and third FIR filters for receiving the first and third intermediate output signals, respectively, and generating a compensated I output signal; and
   a second adder connected to the second and fourth FIR filters for receiving the second and fourth intermediate output signals, respectively, and generating a compensated Q output signal.

14. The system of claim 13, wherein the first value comprises a first set of bits that is indicative of a count of the first set of filter taps, the second value comprises a second set of bits that is indicative of a count of the second set of filter taps, the third value comprises a third set of bits that is indicative of a count of the third set of filter taps, and the fourth value comprises a fourth set of bits that is indicative of a count of the fourth set of filter taps.

15. The system of claim 14, wherein the first FIR filter further includes a first set of delay modules and a first set of select logic modules each corresponding to the first set of filter taps.

16. The system of claim 15, wherein the second FIR filter further includes a second set of delay modules and a second set of select logic modules each corresponding to the second set of filter taps.

17. The system of claim 16, wherein the third FIR filter further includes a third set of delay modules and a third set of select logic modules each corresponding to the third set of filter taps.

18. The system of claim 17, wherein the fourth FIR filter further includes a fourth set of delay modules and a fourth set of select logic modules each corresponding to the fourth set of filter taps.

19. The system of claim 18, wherein a select logic module of the first set of select logic modules selects corresponding filter tap of the first set of filter taps for at least one of the first I and first Q signal paths, a select logic module of the second set of filter taps selects corresponding filter tap of the second set of filter taps for at least one of the first I and first Q signal paths, a select logic module of the third set of filter taps selects corresponding filter tap of the third set of filter taps for at least one of the second I and second Q signal paths, and a select logic module of the fourth set of filter taps selects corresponding filter tap of the fourth set of filter taps for at least one of the second I and second Q signal paths.

20. The system of claim 19, further comprising:
   a first set of XOR gates, connected to the first programmable register for receiving the first value, and generating a first set of select signals;
   a first set of multiplexers, connected to the first set of XOR gates for receiving the first set of select signals, for receiving the I input signal, and providing first and second sets of samples of the I input signal to the first and second FIR filters, respectively, wherein the first and second FIR filters generate the first and second intermediate output signals based on the first and second sets of samples, respectively;
   a second set of XOR gates connected to the fourth programmable register for receiving the third value, and generating a second set of select signals; and
   a second set of multiplexers, connected to the second set of XOR gates for receiving the second set of select signals, for receiving the Q input signal, and providing third and fourth sets of samples of the Q input signal to the third and fourth FIR filters, respectively, wherein the third and fourth FIR filters generate the third and fourth intermediate output signals based on the third and fourth sets of samples, respectively.

* * * * *